(12) United States Patent
Moellmer et al.

(10) Patent No.: US 9,070,853 B2
(45) Date of Patent: Jun. 30, 2015

(54) PACKAGE FOR AN OPTOELECTRONIC SEMICONDUCTOR COMPONENT AND SEMICONDUCTOR COMPONENT

(75) Inventors: Frank Moellmer, Matting bei Pentling (DE); Markus Arzberger, Regensburg (DE); Michael Schwind, Sinzing (DE); Thomas Hoefer, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 148 days.

(21) Appl. No.: 13/825,303

(22) PCT Filed: Sep. 13, 2011

(86) PCT No.: PCT/EP2011/065847
§ 371 (c)(1),
(2), (4) Date: Jun. 14, 2013

(87) PCT Pub. No.: WO2012/038304
PCT Pub. Date: Mar. 29, 2012

(65) Prior Publication Data
US 2013/0256736 A1    Oct. 3, 2013

(30) Foreign Application Priority Data

Sep. 20, 2010  (DE) .......................... 10 2010 046 090

(51) Int. Cl.
| H01L 23/495 | (2006.01) |
| H01L 33/62 | (2010.01) |
| H01L 33/48 | (2010.01) |
| H01S 5/022 | (2006.01) |
| H01L 33/64 | (2010.01) |
| H01S 5/024 | (2006.01) |

(52) U.S. Cl.
CPC ................ *H01L 33/62* (2013.01); *H01L 33/48* (2013.01); *H01L 33/486* (2013.01); *H01S 5/02272* (2013.01); *H01L 33/483* (2013.01); *H01L 33/647* (2013.01); *H01S 5/02212* (2013.01); *H01S 5/0226* (2013.01); *H01S 5/02276* (2013.01); *H01S 5/02469* (2013.01); *H01L 2224/48091* (2013.01); *H01L 2224/48247* (2013.01); *H01L 2224/32245* (2013.01); *H01L 2224/73265* (2013.01)

(58) Field of Classification Search
None
See application file for complete search history.

(56) References Cited

U.S. PATENT DOCUMENTS

| 5,557,116 A | 9/1996 | Masui et al. |
| 5,606,182 A | 2/1997 | Yoshida et al. |
| 5,825,054 A | 10/1998 | Lee et al. |
| 5,993,075 A | 11/1999 | Huang et al. |
| 2003/0012036 A1* | 1/2003 | Uemura et al. ............... 362/555 |
| 2003/0231673 A1 | 12/2003 | Uchida et al. |

(Continued)

FOREIGN PATENT DOCUMENTS

| CN | 1093837 A | 10/1994 |
| CN | 2255682 Y | 6/1997 |

(Continued)

*Primary Examiner* — Fei Fei Yeung Lopez
(74) *Attorney, Agent, or Firm* — Slater & Matsil, L.L.P.

(57) ABSTRACT

A package for an optoelectronic semiconductor component is disclosed. The package includes a package body, a first connecting lead and a second connecting lead. The first connecting lead and the second connecting lead each extend in a vertical direction through the package body. A semiconductor component with such a package and a semiconductor chip are also disclosed.

14 Claims, 6 Drawing Sheets

(56) References Cited

U.S. PATENT DOCUMENTS

| | | |
|---|---|---|
| 2004/0032888 A1 | 2/2004 | Ferstl |
| 2005/0072985 A1 | 4/2005 | Yamamoto |
| 2005/0194601 A1 | 9/2005 | Suenaga |
| 2007/0228535 A1 | 10/2007 | Fujino et al. |
| 2009/0103581 A1 | 4/2009 | Bessho |
| 2010/0128750 A1 | 5/2010 | Fukuda et al. |

FOREIGN PATENT DOCUMENTS

| | | |
|---|---|---|
| DE | 102 60 432 A1 | 7/2004 |
| DE | 10 2007 014 685 A1 | 10/2007 |
| EP | 0 607 700 A2 | 7/1994 |
| EP | 0 658 933 A2 | 6/1995 |
| JP | 5121841 A | 5/1993 |
| JP | 2002-261332 A | 9/2002 |
| JP | 2002-353514 A | 12/2002 |

* cited by examiner

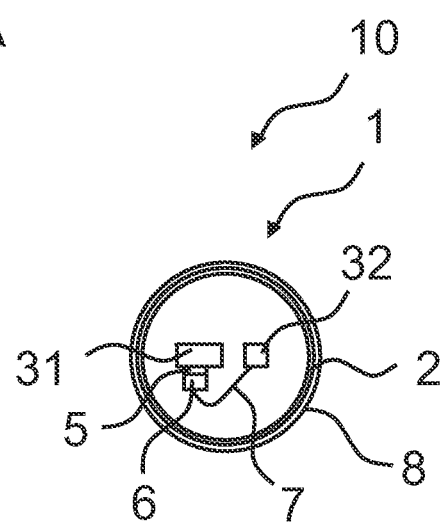
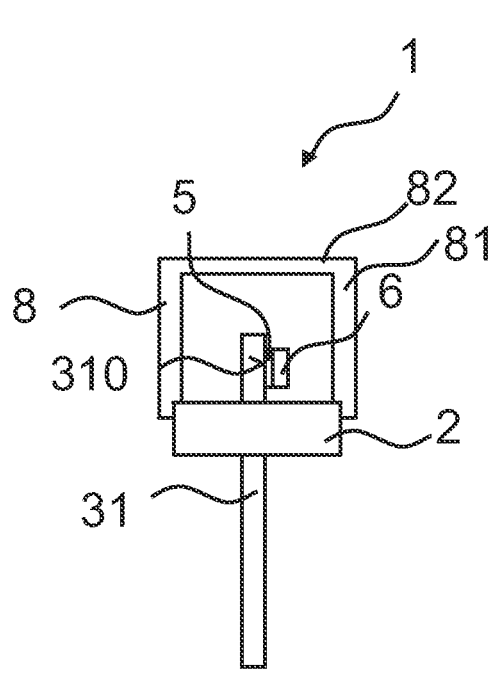
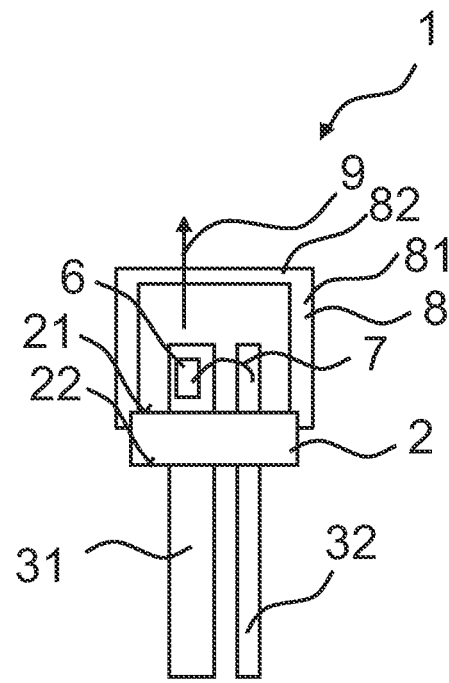

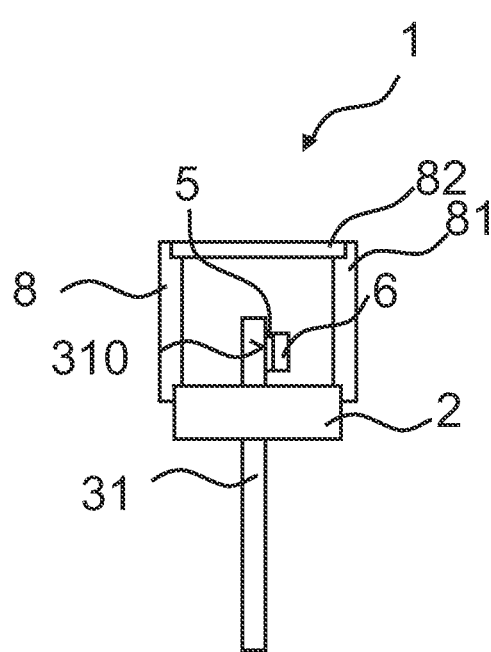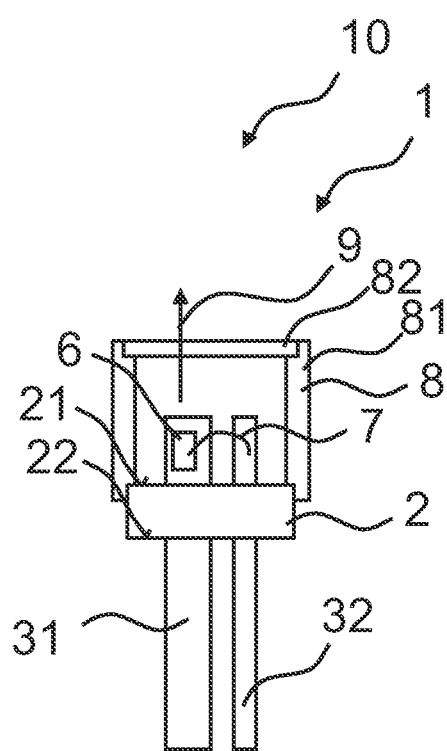

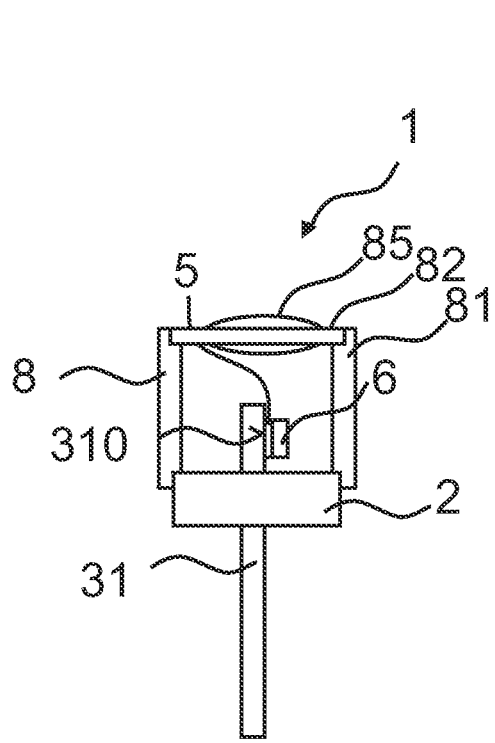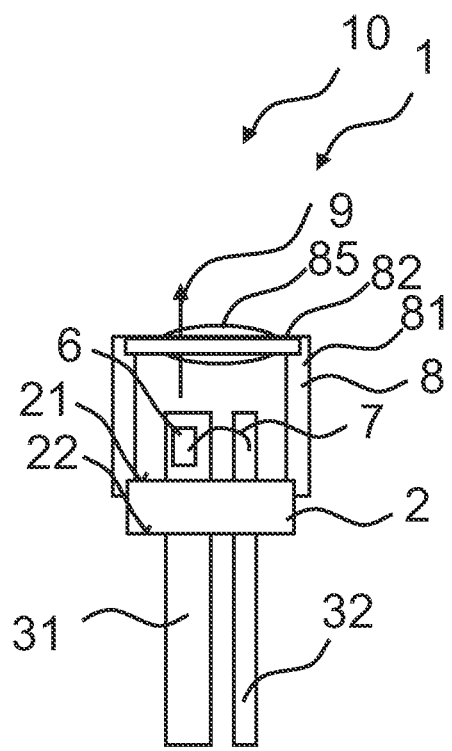

PACKAGE FOR AN OPTOELECTRONIC SEMICONDUCTOR COMPONENT AND SEMICONDUCTOR COMPONENT

This patent application is a national phase filing under section 371 of PCT/EP2011/065847, filed Sep. 13, 2011, which claims the priority of German patent application 10 2010 046 090.7, filed Sep. 20, 2010, each of which is incorporated herein by reference in its entirety.

TECHNICAL FIELD

The present application relates to a package for an optoelectronic semiconductor component and to a semiconductor component with such a package.

BACKGROUND

"TO" packages, for example, TO56, TO38 or TO9 packages, are often used for semiconductor laser diodes with waste heat outputs up to the watt range. However, due to their comparatively complicated structure, these metal packages are too costly for consumer market applications.

SUMMARY OF THE INVENTION

In one aspect, the invention provides a package for an optoelectronic semiconductor component which may be produced simply and inexpensively and simultaneously ensures good heat dissipation from the semiconductor component.

According to an embodiment, a package for an optoelectronic semiconductor component comprises a package body, a first connecting lead and a second connecting lead. The first connecting lead and the second connecting lead in each case extend in the vertical direction through the package body.

The first connecting lead and the second connecting lead in each case project from two opposite sides of the package body. The connecting leads may thus in each case serve on one side of the package body for electrical contacting of an optoelectronic semiconductor chip and on the opposite side of the package body for external electrical contacting of the semiconductor component. The first connecting lead is preferably provided for fastening the semiconductor chip.

In a preferred configuration, the package body is a plastics body which is molded onto the first connecting lead and the second connecting lead. Such a package body may be produced particularly simply and inexpensively by means of a molding method. A molding method is generally taken to mean a method with which a molding composition may be provided with a predetermined shape, for example, by means of casting, injection molding or transfer molding.

In the event of doubt, the vertical direction is in particular taken to mean a direction which extends perpendicularly to a main plane of extension of the package body. At least one of the main faces of the package body preferably extends parallel to the main plane of extension of the package body.

In a preferred configuration, the first connecting lead and the second connecting lead are spaced apart from one another in a lateral direction extending perpendicularly to the vertical direction. The connecting leads are thus mechanically stably joined together merely via the package body. The first connecting lead and the second connecting lead furthermore preferably extend parallel to one another.

In a further preferred configuration, a side face of the first connecting lead extending along the vertical direction is provided as a mounting face for a semiconductor chip. A semiconductor chip constructed as an edge-emitting semiconductor laser chip thus emits in the vertical direction.

In a further preferred configuration, the first connecting lead and the second connecting lead extend in a plane which is defined by the vertical direction and by the lateral direction. In other words the plane in which the connecting leads are provided and the main plane of extension of the package body extend perpendicularly to one another.

When producing the package, the first connecting lead and the second connecting lead may be obtained in simple manner from a planar metal sheet. The metal sheet may, for example, contain copper or a copper-containing alloy or consist of such a material.

In a preferred configuration, the first connecting lead is constructed such that the waste heat generated in the semiconductor chip during operation of the semiconductor component may be dissipated efficiently via the first connecting lead.

The first connecting lead preferably has a cross-section of at least 1 mm$^2$. Even semiconductor chips which, in operation, generate waste heat outputs of 0.1 W or more may be mounted in a package having such a first connecting lead.

The first connecting lead may thus provide both electrical and thermal contacting of the semiconductor chip. A separate connection for heat dissipation is thus not necessary.

The first connecting lead furthermore preferably has a larger cross-section than the second connecting lead at each point along the vertical direction.

In a preferred configuration, the package comprises a cap which surrounds the first connecting lead and the second connecting lead on one side of the package body. The semiconductor chip may be protected from external influences such as mechanical loads or moisture by means of the cap. The cap is preferably constructed such that it may be pushed onto the package body. Once the semiconductor chip has been mounted in the package, the cap can be fastened to the package body. Depending on the application, the connection with the package body may be permanent or detachable, for example, by means of a plug-in connection or a latching connection.

In a preferred configuration, an optical element, for example, a lens, is integrated into the cap. The cap may thus simultaneously serve to protect the semiconductor chip from mechanical loads and to shape, in particular to collimate, the emitted radiation.

The cap preferably comprises a lid and a jacket surrounding the lid. The lid is conveniently configured to be transmissive to the radiation to be generated by the semiconductor chip, for example, radiation in the ultraviolet, visible and/or infrared spectral range. The lid may form the optical element.

In one variant configuration, the cap is of one-piece construction and is radiation-transmissive.

In an alternative variant configuration, the lid and the jacket comprise materials which differ from one another. The jacket need not necessarily be configured to be transmissive to the radiation to be generated by the semiconductor chip.

For example, the jacket may contain a metal or a metal alloy or consist of such a material.

By means of a jacket which is non-transmissive to radiation, it is possible to ensure that radiation is not unintentionally emitted in the lateral direction from the semiconductor component.

The package may also comprise more than two connecting leads. For example, a further connecting lead may be provided for electrical contacting of an electrical control circuit.

The described package is in particular suitable for a semiconductor component in which a semiconductor chip is fastened to the first connecting lead. A main emission direction of the semiconductor chip preferably extends along the vertical direction.

The semiconductor chip is preferably mounted in the package without an enclosure surrounding the semiconductor chip. In comparison with a type of package in which the semiconductor chip, once mounted on a lead frame, is encapsulated with a potting material, the semiconductor component is distinguished by elevated ageing resistance. In this way, it is possible to rule out the risk of a reduction in the emitted radiant power due to discoloration or turbidity of the enclosure.

The semiconductor chip may be fastened to the first connecting lead by means of a solder. A soldered joint is distinguished by elevated thermal conductivity.

Alternatively, the semiconductor chip may also be fastened to the first connecting lead by means of an adhesive. The semiconductor chip is preferably fastened by means of an adhesive with an elevated content of conductive filler particles. An elevated filler content is taken to mean in the present connection that the adhesive contains electrically conductive particles, for example, metal particles, for instance silver particles, in a proportion by weight of at least 80%.

The package is preferably constructed such that, on the side remote from the semiconductor chip, the package body forms a bearing surface on which the package rests over its entire area or at least in zones when mounted on a connection carrier.

An electrical control circuit for the semiconductor chip is furthermore preferably integrated in the semiconductor component. The electrical control circuit may in particular be arranged within the package. An electrical control circuit is described, for example, in U.S. Patent Publication No. 2004/0032888, the disclosure content of which in this respect is hereby included by reference.

The electrical control circuit is conveniently electrically conductively connected to the semiconductor chip and is furthermore preferably externally electrically contactable by means of a further connecting lead.

The control circuit is preferably arranged on one of the connecting leads. In particular, the control circuit and the semiconductor chip may be arranged on the first connecting lead.

BRIEF DESCRIPTION OF THE DRAWINGS

Further features, configurations and convenient aspects are revealed by the following description of the exemplary embodiments in conjunction with the figures, in which:

FIGS. 2A to 2C show a second exemplary embodiment of a semiconductor component with a package in schematic plan view (FIG. 2A) and, in FIGS. 2B and 2C, in two side views from directions perpendicular to one another;

FIGS. 3A and 3B show a third exemplary embodiment of a semiconductor component with a package by means of two side views from directions perpendicular to one another;

FIGS. 5A and 5B show a fifth exemplary embodiment of a semiconductor component with a package by means of two side views from directions perpendicular to one another.

Identical, similar or identically acting elements are provided with the same reference numerals in the figures.

The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1A:
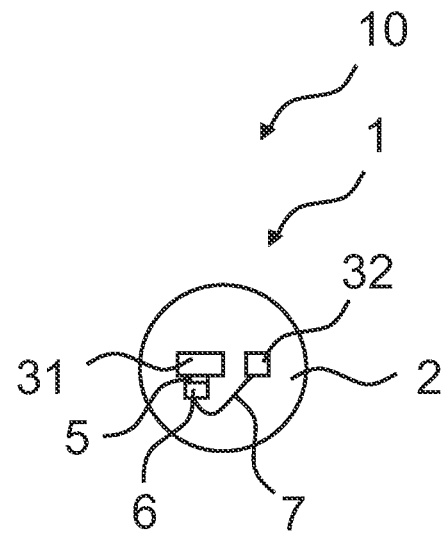
FIGS. 1A to 1C show a first exemplary embodiment of a semiconductor component with a package in schematic plan view (FIG. 1A) and, in FIGS. 1B and 1C, in two side views from directions perpendicular to one another.
Figure 1B:
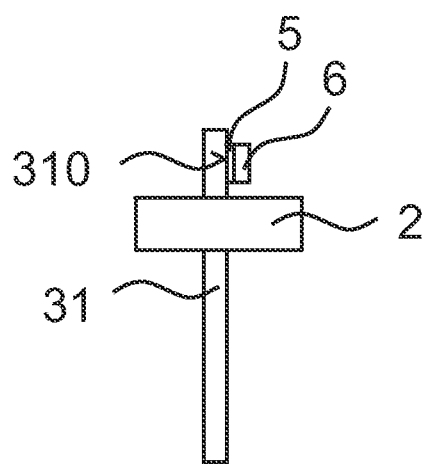
Figure 1C:
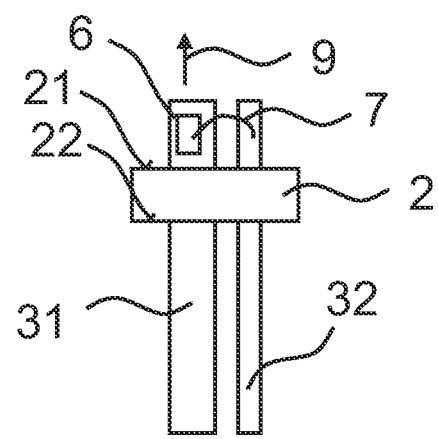

A first exemplary embodiment of a semiconductor component 10 with a package 1 and a semiconductor chip 6 fastened to the chip is illustrated schematically in FIGS. 1A to 1C. The package 1 comprises a package body 2, a first connecting lead 31 and a second connecting lead 32. The connecting leads form a lead frame for the package. The package body 2 has a first major face 21 and a second major face 22, between which the package body 2 extends in the vertical direction.

The first connecting lead 31 and the second connecting lead 32 extend parallel to one another and pass through the package body 2 in the vertical direction, in particular perpendicular to the first major face. A plane defined by the connecting leads thus extends perpendicularly to the first major face 21 of the package body. A side face 310, extending in a vertical direction, of the first connecting lead 31 forms a mounting face 310, to which the semiconductor chip 6 on the prefabricated package 1 is fastened. The semiconductor chip 6 is fastened to the first connecting lead 31 by means of a bonding layer 5. A solder or an electrically conductive adhesive is in particular suitable for the bonding layer. In order to increase thermal and electrical conductivity, the adhesive preferably takes the form of an adhesive with an elevated content of electrically conductive filler particles. The adhesive preferably contains electrically conductive particles in a proportion by weight of at least 80%.

The package body 2 preferably takes the form of a plastics body which is molded onto the connecting leads 31, 32. The package body may, for example, be produced by means of a molding method, for instance, by casting, injection molding or transfer molding.

The plastics body may for example contain a polymer material, for instance a liquid crystal polymer material and/or a thermoplastic, for instance polyetheretherketone (PEEK), or consist of such a material.

During production, the first connecting lead 31 and the second connecting lead 32 may be produced from a planar metal sheet, for example, a copper sheet or a metal sheet based on a copper alloy. For example, the first connecting lead 31 and the second connecting lead 32 may be formed simply and reproducibly by means of stamping.

The second connecting lead 32 is connected via a connecting line 7, for instance, a wire bond connection, to the semiconductor chip 6. The portions of the connecting leads 31, 32 which project out of the package body 2 on the second major face 22 side thus serve to provide external electrical contacting of the semiconductor component 10. By connecting the connecting leads to an external current source, charge carriers may, during operation of the semiconductor component, be injected from different sides into an active zone (not explicitly illustrated), provided for generating radiation, of the semiconductor chip 6 where they recombine, resulting in the emission of radiation.

In the exemplary embodiment shown, the semiconductor chip 6 takes the form of an edge-emitting semiconductor laser chip. A main emission direction of the semiconductor chip 6 is illustrated by means of an arrow 9.

The main emission direction thus extends in the vertical direction, namely perpendicularly to a main plane of extension of the package body 2.

The cross-section of the first connecting lead 31 is conveniently adapted to the waste heat output of the semiconductor chip 6 to be mounted such that the generated waste heat may be efficiently dissipated from the semiconductor chip.

The cross-sectional area preferably amounts to at least 1 $mm^2$. It has, for example, been found that with a cross-section of the first connecting lead 31 of 1×2.5 $mm^2$ made from a copper sheet and with solder as bonding layer, it is possible to achieve thermal resistance of 50 K/W or less.

The described package 1 is thus in particular suitable for semiconductor chips having a waste heat output of 0.1 W or more.

The package 1 is furthermore distinguished by its particularly simple structure and by being inexpensive to manufacture. In particular, the connecting leads 31, 32 may be obtained by simple patterning from a base material which is in planar form. By arranging the main plane of extension of the connecting leads 31, 32 perpendicular to the main plane of extension of the package body 2, a package is simply obtained in which an edge-emitting laser has its main emission direction perpendicular to the main plane of extension of the package.

When mounting the semiconductor component, the semiconductor component may rest, in particular over its entire area, on the second major face 22 side of the package body 2 on a connection carrier, for instance a printed circuit board (PCB).

In the exemplary embodiment shown, the package body 2 is of circular construction in plan view. However, depending on the application, another base area may also be used, for example, a base area with an oval basic shape or a rectangular basic shape.

FIGS. 2A to 2C schematically illustrate a second exemplary embodiment of a semiconductor component 10 with a package 1. This exemplary embodiment substantially corresponds to the first exemplary embodiment described in connection with FIG. 1.

At variance therewith, the package 1 comprises a cap 8 in addition to the package body 2. The cap 8 comprises a jacket 81 which surrounds the package body 2 in the lateral direction and a lid 82 which extends parallel to the first major face 21 of the package body. In this exemplary embodiment, the cap with jacket and lid is of one-piece construction.

The cap, in particular the lid, is conveniently configured to be transparent or at least translucent to the radiation generated during operation of the semiconductor chip, for example, radiation in the ultraviolet, visible and/or infrared spectral range. The cap may, for example, contain a plastic or a glass or consist of such a material.

The cap 8 in particular serves to protect the semiconductor chip 6 from external influences such as mechanical loads, moisture or dust.

The semiconductor chip 6 need not be enclosed for this purpose. In this way, the risk of degradation of the emitted output power due to ageing effects of the enclosure material may be avoided. The interior of the package 1 which is enclosed, preferably in leak-proof manner, by the cap 8 and the package body 2 may be air-filled or filled with a protective gas. The interior may furthermore be at normal atmospheric pressure, at a reduced pressure or at an elevated pressure.

FIGS. 3A and 3B illustrate a third exemplary embodiment of a semiconductor component with a package. The third exemplary embodiment substantially corresponds to the second exemplary embodiment described in connection with FIGS. 2A to 2C.

At variance therewith, the jacket 81 and the lid 82 of the cap 8 are manufactured as separate components. In this case, the jacket may also be manufactured from a material which is non-transmissive to the radiation generated by the semiconductor chip 6. For example, the jacket may contain a metal or a metal alloy or consist of such a material.

For greater ease of depiction, in the side views the lid 8 is in each case merely shown in sectional view.

The lid 82 is inserted into the jacket 81 and conveniently mechanically robustly and durably joined to the jacket.

Depending on the application, the cap 8 may be detachably, for example, peelably, fastened to the package body 2 or durably mechanically robustly joined to package body 2, for example, by means of an adhesive.

Figure 4A:
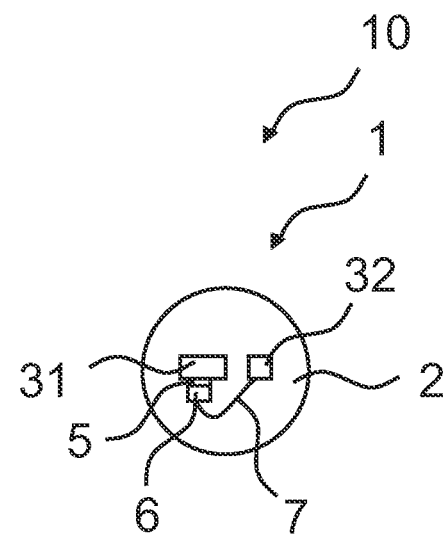
FIGS. 4A to 4C show a fourth exemplary embodiment of a semiconductor component with a package in schematic plan view (FIG. 4A) and, in FIGS. 4B and 4C, in two side views from directions perpendicular to one another.
Figure 4B:
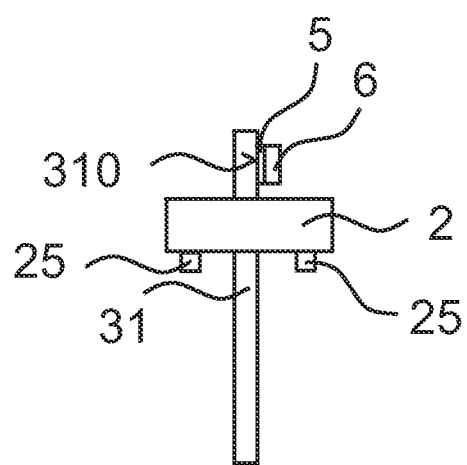
Figure 4C:
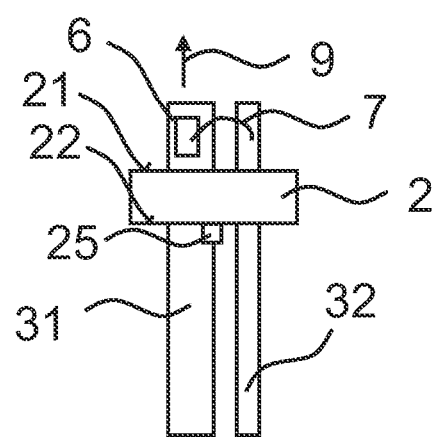

FIGS. 4A to 4C schematically illustrate a fourth exemplary embodiment of a semiconductor component. This fourth exemplary embodiment substantially corresponds to the first exemplary embodiment described in connection with FIGS. 1A to 1C. At variance therewith, the package body 2 comprises raised portions 25 on the second major face 22 side. The raised portions are provided as bearing points during mounting of the semiconductor component, for example, on a printed circuit board. Looking in plan view onto the package body, the raised portions are arranged on opposite sides of the connecting leads 31, 32. The risk of tilting of the semiconductor component is reduced in this manner. At variance with the illustration shown, more than two raised portions, for example, three raised portions, or also only one raised portion may be convenient. The at least one raised portion simplifies accurate positioning of the semiconductor component 10 during mounting.

FIGS. 5A and 5B schematically illustrate a fifth exemplary embodiment of a semiconductor component. This fifth exemplary embodiment substantially corresponds to the third exemplary embodiment described in connection with FIGS. 3A and 3B. At variance therewith, the cap 8 comprises an optical element 85, which by way of example in this exemplary embodiment takes the form of a lens. On at least one side, the optical element is preferably convexly curved along at least one spatial direction. For example, the optical element may take the form of a convex or a plano-convex lens. A cylindrical lens may also be used. The radiation generated during operation of the semiconductor chip 6 may be shaped, in particular collimated, by means of the optical element. In the described exemplary embodiment, the optical element 85 is integrated in the lid 82. In contrast thereto, the optical element may also be provided in a one-piece configuration of the cap 8, as is in particular described in connection with FIGS. 2A to 2C.

Figure 6:
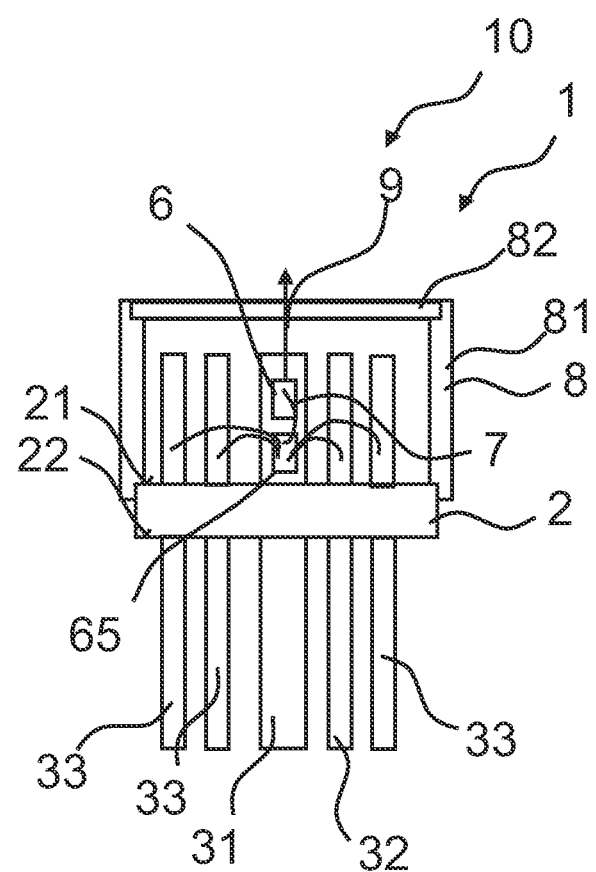
FIG. 6 shows a sixth exemplary embodiment of a semiconductor component with a package by means of a side view.

FIG. 6 schematically illustrates a sixth exemplary embodiment of a semiconductor component. This sixth exemplary embodiment substantially corresponds to the third exemplary embodiment described in connection with FIGS. 3A and 3B. At variance therewith, the package 1 comprises three further connecting leads 33 in addition to the first connecting lead 31 and the second connecting lead 32. The further connecting leads 33 are provided for electrically contacting an electrical control circuit 65. The electrical control circuit preferably takes the form of an integrated circuit. The control circuit is directly connected to the semiconductor chip 6, for example, by means of a connecting line 7. Integration of the control circuit in the interior of the package 1 and the associated short electrical connecting lines simplify the generation of very short pulses. At least one capacitor may furthermore be arranged in the package.

In the exemplary embodiment shown, the semiconductor chip 6 and the electrical control circuit 65 are fastened to the first connecting lead 31. The relatively large cross-section of the first connecting lead accordingly simplifies mounting of the control circuit. The control circuit may, however, also be fastened to one of the other connecting leads.

The further connecting leads 33 may in each case, for example, be provided for a supply voltage of the electrical control circuit, for an earth contact or as a trigger input.

It goes without saying such an electrical control circuit may also be used in the further above-described exemplary embodiments of the semiconductor component, in particular irrespective of the specific configuration of the cap 8.

The described design of the package 1 is distinguished by particularly elevated flexibility with regard to the specific configuration. In particular, the number of connecting leads may be varied in simple manner during production.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A package for an optoelectronic semiconductor component, the package comprising:
   a package body;
   a first connecting lead; and
   a second connecting lead, the first connecting lead and the second connecting lead each extending in a vertical direction through the package body,
   wherein the first connecting lead has a cross-section of at least 1 mm$^2$ in a plane running perpendicular to the vertical direction; and
   wherein the cross-section of the first connecting lead is larger than the second connecting lead at each point along the vertical direction.

2. The package according to claim 1, wherein the package body comprises a plastics body which is moulded onto the first connecting lead and the second connecting lead.

3. The package according to claim 1, wherein the first connecting lead and the second connecting lead are spaced apart from one another in a lateral direction, the lateral direction extending perpendicularly to the vertical direction.

4. The package according to claim 1, wherein a side face of the first connecting lead extending along the vertical direction is provided as a mounting face for a semiconductor chip.

5. The package according to claim 1, wherein the first connecting lead and the second connecting lead extend in a plane that is defined by the vertical direction and by a lateral direction that is perpendicular to the vertical direction.

6. The package according to claim 1, wherein the package comprises a cap that surrounds the first connecting lead and the second connecting lead on one side of the package body.

7. The package according to claim 6, wherein the cap is constructed such that it may be pushed onto the package body.

8. The package according to claim 6, wherein the cap is of one-piece construction and transmissive to radiation in the ultraviolet, visible and/or infrared spectral range.

9. The package according to claim 6, wherein the cap comprises a lid and a jacket surrounding the lid, the lid being transmissive to radiation in the ultraviolet, visible and/or infrared spectral range and the jacket containing a metal.

10. The semiconductor component comprising:
    a package according to claim 1; and
    a semiconductor chip fastened to the first connecting lead.

11. The semiconductor component according to claim 10, wherein the semiconductor chip comprises a main emission direction that extends along the vertical direction.

12. The semiconductor component according to claim 10, wherein the semiconductor chip is mounted in the package without an enclosure surrounding the semiconductor chip.

13. The semiconductor component according to claim 10, wherein the semiconductor chip is fastened to the first connecting lead by a solder or by an adhesive with a content of conductive filler particles.

14. The semiconductor component according to claim 10, further comprising an electrical control circuit for the semiconductor chip arranged within the package.

* * * * *